United States Patent
Dunlop et al.

[19]

[11] Patent Number: 6,030,514
[45] Date of Patent: Feb. 29, 2000

[54] METHOD OF REDUCING SPUTTERING BURN-IN TIME, MINIMIZING SPUTTERED PARTICULATE, AND TARGET ASSEMBLY THEREFOR

[75] Inventors: John A. Dunlop, Phoenix, Ariz.; Michael Goldstein, Sunnyvale, Calif.; Gerald B. Feldewerth, Phoenix, Ariz.; Cari Shim, Sunnyvale, Calif.; Stephan Schittny, Phoenix, Ariz.

[73] Assignees: Sony Corporation, Tokyo, Japan; Materials Research Corporation, Orangeburg, N.Y.

[21] Appl. No.: 08/850,707

[22] Filed: May 2, 1997

[51] Int. Cl.[7] .............................. C23C 14/34; B65B 31/00
[52] U.S. Cl. ................................ 204/298.12; 204/192.12; 204/192.34; 205/640; 134/1; 134/1.1; 216/13; 216/52; 216/65; 216/66; 216/67; 216/74; 216/75; 216/94; 216/96; 216/100; 53/396; 53/408
[58] Field of Search ......................... 204/192.1, 192.12, 204/192.34, 298.12, 298.13; 205/640; 134/1, 1.1; 216/52, 53, 65, 66, 67, 74, 75, 88, 89, 94, 96, 100, 102, 105, 13; 53/396, 408

[56] References Cited

U.S. PATENT DOCUMENTS

| | | | |
|---|---|---|---|
| 3,827,472 | 8/1974 | Uramoto | 383/204 |
| 4,450,062 | 5/1984 | Macaulay | 204/298.11 |
| 4,619,695 | 10/1986 | Oikawa et al. | 75/10.65 |
| 4,882,022 | 11/1989 | Hoffman et al. | 204/192.15 |
| 4,886,162 | 12/1989 | Ambrogio | 206/710 |
| 4,941,915 | 7/1990 | Matsuoka et al. | 204/298.12 |
| 5,035,787 | 7/1991 | Parker et al. | 204/192.34 |
| 5,104,684 | 4/1992 | Tao et al. | 427/526 |
| 5,112,468 | 5/1992 | Weigert et al. | 204/192.13 |
| 5,273,634 | 12/1993 | Fukui et al. | 204/192.34 |
| 5,324,448 | 6/1994 | Mayeaux | 252/194 |
| 5,358,615 | 10/1994 | Grant et al. | 204/192.15 |
| 5,529,671 | 6/1996 | Delbley et al. | 204/192.34 |
| 5,549,205 | 8/1996 | Doche | 206/710 |

FOREIGN PATENT DOCUMENTS

| | | | |
|---|---|---|---|
| 252 005 A1 | 12/1987 | Germany | 204/298.13 |
| 3-257158 | 11/1991 | Japan . | |
| 4-231461 | 8/1992 | Japan . | |
| WO 92/04482 | 3/1992 | WIPO . | |

*Primary Examiner*—Rodney McDonald
*Attorney, Agent, or Firm*—Wood, Herron & Evans, L.L.P.

[57] ABSTRACT

A target for sputtering is subjected to a surface treatment process and special packaging after target manufacture for improved sputtering performance and process and yield by reducing particulates. The sputtering target is first surface treated to remove oxides, impurities and contaminants. The surface treated target is then covered with a metallic enclosure and, optionally, a passivating barrier layer. The metallic enclosure protects the target surface from direct contact with subsequently employed packaging material such as plastic bags, thereby eliminating sources of organic materials during sputtering operations. The surface treatment of the target removes deformed material, smearing, twins, or burrs and the like from the target surface, reducing "burn-in" or sputter conditioning time prior to production sputtering of thin films.

29 Claims, 9 Drawing Sheets

SCANNING ELECTRON MICROSCOPE - SECONDARY ELECTRONS

METHOD OF REDUCING SPUTTERING BURN-IN TIME, MINIMIZING SPUTTERED PARTICULATE, AND TARGET ASSEMBLY THEREFOR

FIELD OF THE INVENTION

The present invention is directed to a method of reducing sputtering target conditioning time or so called burn-in and a target assembly therefor and, in particular, to a method of surface treating a sputtering target and packaging the surface treated target to reduce sputtered particulate and thin film defects while reducing burn-in time.

BACKGROUND ART

Currently, sputtering techniques are the primary method used for depositing thin film metallic interconnects and adhesion layers, particularly for the manufacture of VLSI devices. As technology advances with respect to the manufacture of semiconductor devices, the semiconductor wafers are becoming larger, the line dimensions smaller, the number of transistors is increasing and the circuits are becoming more complex. These advances are requiring additional metallization layers and tighter tolerances. Connecting circuits are often created in multiple steps. For each metallic layer of the connecting circuit, a sequence of uniform thin films are sputtered onto the surface of the patterned semiconductor wafer. The sputtered layers are subsequently etched to form the required circuits.

Targets used in present day sputtering systems are generally conditioned or burned-in before they can be used for product wafers. The burn-in time and other variables are dependent on a particular sputtering system to be used. The purpose of the burn-in process is to remove any residual contaminants adsorbed or absorbed on the surface of the target which may adversely affect the quality of the sputtered film and reduce particle levels to acceptable limits. The residual contaminants can occur as a result of the packaging, shipment or storage of the target. Other contaminants intended for removal during burn-in includes the residual surface oxide layer on the target and any areas of targets which may be damaged by the target's final machining process. The burn-in process should leave a clean metal surface ready for sputtering on to production wafers.

During the burn-in process, outgassing and particle generation may occur, particularly if contaminants exist on the target. This outgassing and particle generation may result in contaminants or other foreign elements and particulates being trapped in the sputtering chamber or deposited onto the shields of the apparatus. These residual contaminants may then impact the performance of the sputtering operation. The particles and other impurities are critical factors in integrated circuit manufacturing which impact the device yield directly. The particles and impurities must be kept at levels as low as possible to maximize the device yield.

The burn-in processing is a non-value step as part of the sputtering process. This non-value step impacts the entire manufacturing process and can contribute to increased cost of ownership. To illustrate, sputtering systems are very expensive (about $3 million) and downtime on this equipment is estimated at $0.5 million per hour (~$10,000 per wafer at 50 wafers per hour). Burn-in of a new target generally takes 1 to 6 hours that can not be used for production. Reducing burn-in time will result in significant savings and reduction of cost of ownership.

In view of the disadvantages associated with the need to burn-in a target, i.e., increased manufacturing time and possible adverse effects on the sputtering operation and the manufactured product yield, a need has developed to improve the sputtering target processing sequence to reduce the burn-in time and improve the overall manufacturing process and process yield.

In response to this need, the present invention overcomes the disadvantages noted above by providing a method which surface treats a manufactured sputtering target and encloses the surface treated portion in a protective metal enclosure (either packaging or coating) prior to burn-in. With this invention, reductions in both burn-in time and the generation of contaminants are realized. In one application of the invention burn-in time for an aluminum target was reduced from 5–6 hours to less than one hour. At this point particulate was minimized and processing fully stable.

SUMMARY OF THE INVENTION

Accordingly, it is a first object of the present invention to improve sputtering operations and yield by reducing the sputtering target burn-in time.

Another object of the invention is the minimization of particle generation and outgassing during the burn-in of sputtering targets.

A further object of the present invention is a target assembly including a surface treated target for sputtering and a metal enclosure which, when combined, prevents gross particle generation during initial phases of the sputtering, reduces oxides on the target surface and protects the target surface from direct contact with packaging material and the associated potential for organic contamination and formation of organic radicals and carbon during the burn-in process.

A still further object of the present invention is improvements in sputtering target yield and target lifetime which reduce the sputtering operation costs and reduce cost of ownership.

Other objects and advantages of the present invention will become apparent as a description thereof proceeds.

In satisfaction of the foregoing objects and advantages, the present invention, in one embodiment, is an improvement in the method of burning-in or conditioning a target prior to use of the target for thin film deposition. The improvement comprises subjecting at least a portion of the target to a surface treatment step whereby deformed material and contaminants present on the portion are removed and the microscopic surface area of the portion is reduced.

At least the surface treated portion of the target is then placed in a metallic enclosure sized to protect the surface treated portion. The metallic enclosure prevents contact between the surface treated portion of the target and any subsequently applied packaging material or enclosure surrounding the target and the metallic enclosure. The surface treatment step combined with the metallic enclosure substantially reduce deformed material and contamination on the target surface resulting in reduced arcing, organic radicals and carbon levels during burn-in. Consequently, the burn-in time is reduced.

The metallic enclosure and target can then be further enclosed in a plastic enclosure such as a double-plastic bag for clean room utilization. A desiccant can be placed in the bag containing the target. The enclosure can be evacuated for shipping and storing purposes.

The surface treatment step can be performed using one of ionic milling or cleaning, sputtering, chemical polishing or etching, electrolytic polishing or etching, laser or electron beam ablation, mechanical or chemo-mechanical polishing, combinations thereof and other techniques which are capable of removing contaminants, oxides or other impurities from the target surface as well as those which can produce a finer surface finish, i.e., reduce the target surface area.

The surface treatment step can be followed by an optional passivating treatment wherein the surface treated portion is coated with a stable barrier thin film coating such as a metal selected from the platinum group metals, noble metals, precious metal group or other types of passivating coatings. The stable thin film coating acts as a barrier to gases contacting the target surface and prevents or inhibits natural oxide formation. Since one object of the burn-in of the target is removal of any native oxide layers on the target, the prevention of formation of such a native layer avoids the need for removing them during the burn-in processing. Exemplary coating materials include gold, platinum, ruthenium and the like.

In a preferred embodiment of the method, the metallic enclosure is a cover or cap attached to the target so that the cover encloses the surface treated portion thereof. The cover can be sized with a lip to vacuum seal around the periphery of the target for both isolation of the surface treated portion and ease of installation and removal.

In another aspect of the invention, the method produces a target assembly including the sputtering target with the surface treated portion and the metallic enclosure sized to enclose at least the surface treated portion of the target.

The target assembly can also include a plastic enclosure, with or without a desiccant. The metallic enclosure can be in the form of a cap with a peripheral lip for attachment to the peripheral edge of the target. Other metallic enclosures can also be used providing they protect the surface treated portion of the target so that it does not come into contact with contaminants after surface treating which may adversely affect the burn-in process and any subsequent sputtering processes.

BRIEF DESCRIPTION OF THE DRAWINGS

Reference is now made to the drawings of the invention wherein.

DESCRIPTION OF THE PREFERRED EMBODIMENTS

Figure 1:
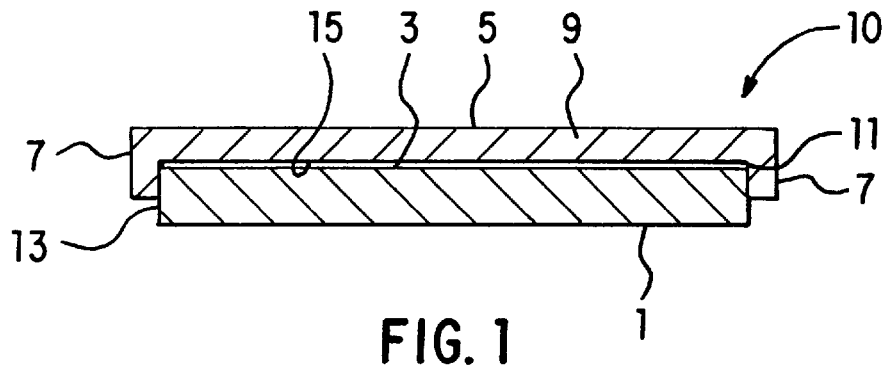
FIG. 1 is a cross-sectional view of an exemplary target assembly.

The present invention relates to the morphology of a sputtering target surface, its conditioning and preservation during shipment and storage until installation into a sputter tool. The invention is intended to minimize the sputtering target outgassing and particle generation during the sputtering target's initial burn-in stage as well as reducing the burn-in time. These objectives are met by the combination of a surface treatment of the target followed by protecting the surface treated portion of the target by a metallic enclosure.

Generally, sputtering targets are manufactured by conventional processing steps such as selecting a target alloy material, melting it and casting it into an ingot. The ingot is then worked, either by hot-working, cold-working or a combination thereof and heat treated to form the final manufactured target. Other conventional steps may include machining, bonding, if required, final machining and cleaning before the target is ready for use in sputtering.

According to the invention, the conventionally produced target is subjected to one or more additional surface treatment steps. The purpose of the surface treatment step is to produce a particle-free surface similar to one that would be produced by a burn-in sequence but without the actual burning-in. The inventive surface treatment step removes contaminants and/or impurities present on the target surface. In addition, the surface treatment step may also reduce the overall microscopic surface area of the treated portion, i.e., makes the surface smoother and flatter for subsequent burn-in and/or sputtering. The surface treatment step also removes any surface damage which may be present on the target surface resulting from final machining performed during the target's manufacture. Removing this surface damage prevents gross particle generation during the initial phases of sputtering. Besides removing any contaminants or surface damage from the final machining step, the surface treatment step may also remove oxides present on the target surface.

As stated above, one purpose of the surface treatment step is to reduce the burn-in time. Thus, if the target surface can be made to resemble a target that has been subjected to a burn-in process, less burn-in time is required, thus improving the economics of the overall device manufacturing process.

This surface treatment step can be any one of a variety of steps which are capable of removing deformed material, impurities, contaminants and/or decreasing microscopic surface area of a target surface. Examples of these processes include ion milling or cleaning, sputtering, chemical polishing or etching, laser or electron beam ablation, electrolytic polishing or etching, mechanical or chemo-mechanical polishing or combinations thereof. Preferred surface treatments includes ion milling or chemical etching but it is believed that any of the processes disclosed above and ones similar thereto can be utilized as part of the surface treatment step of the invention. As an example, the surface of a titanium target surface treated by ion etching shows a distinct change in appearance when viewed using a scanning electron microscope as shown in FIGS. 7A, 7B, 7C and 7D in before and after views. As may be seen in FIGS. 7A, 7B, 7C and 7D, machining grooves and deformed material (black spots and tears) have been significantly minimized by practice of the invention.

As a further example, X-ray diffraction analysis of a machined and chemically etched titanium target shows significant shifts in peak intensities indicating deformed material is being removed by the etching process. Diffraction patterns of as machined and etched targets are shown in FIG. 8A, 8B, 8C and 8D.

Figure 8A:
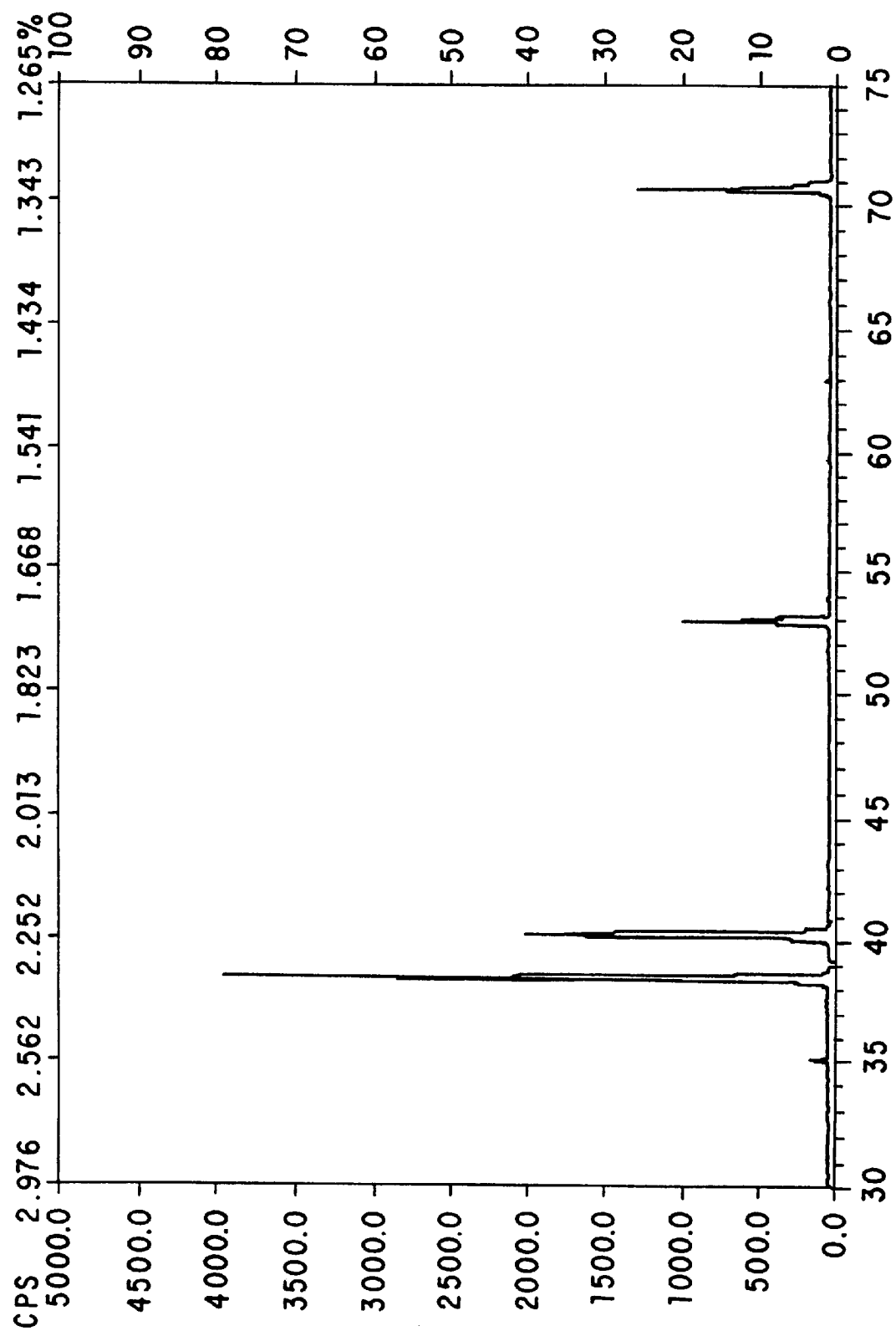
FIGS. 8A, 8B, 8C and 8D are X-ray diffraction patterns which show the effect of chemical etching on the surface texture of a titanium target.
Figure 8B:
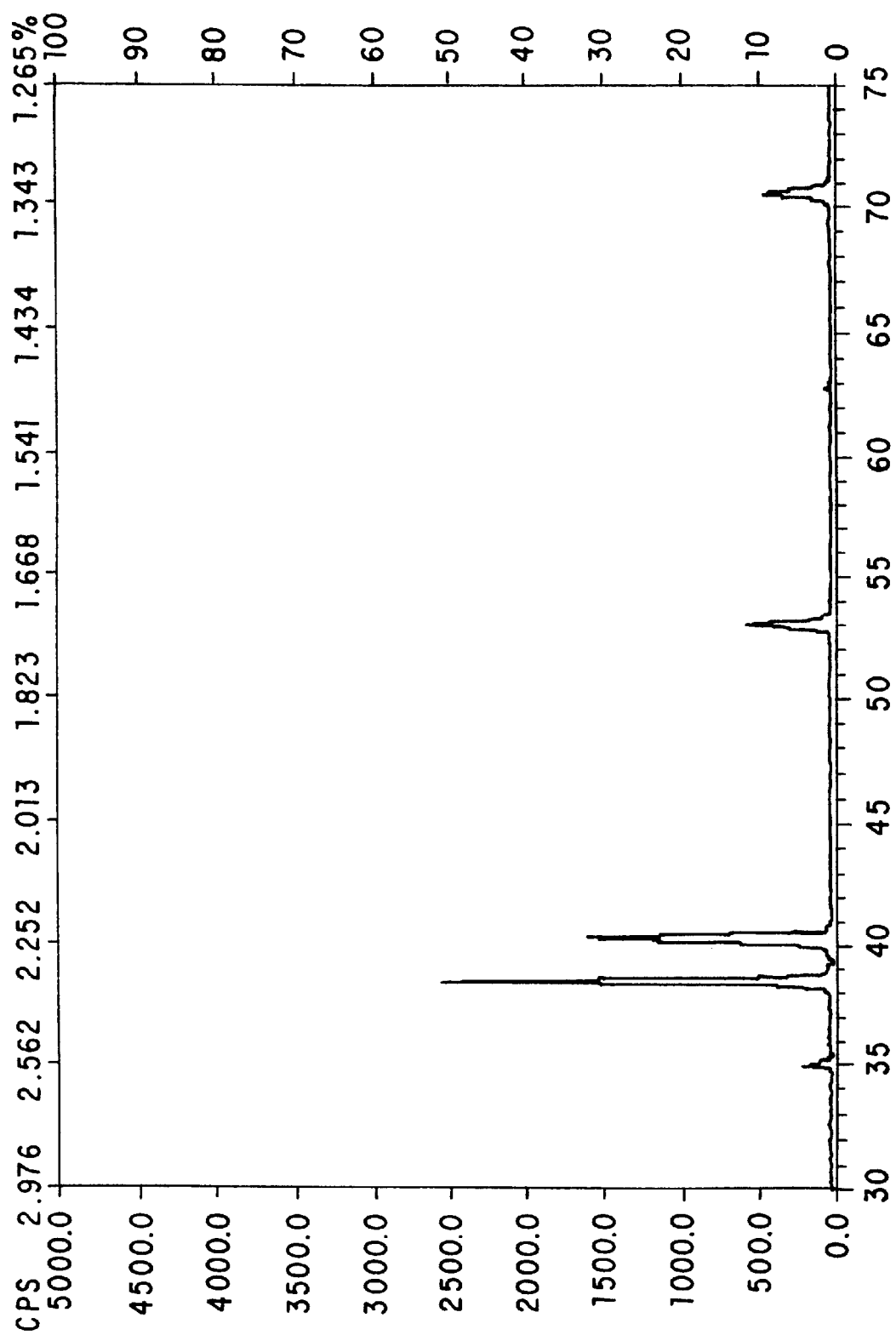
Figure 8C:
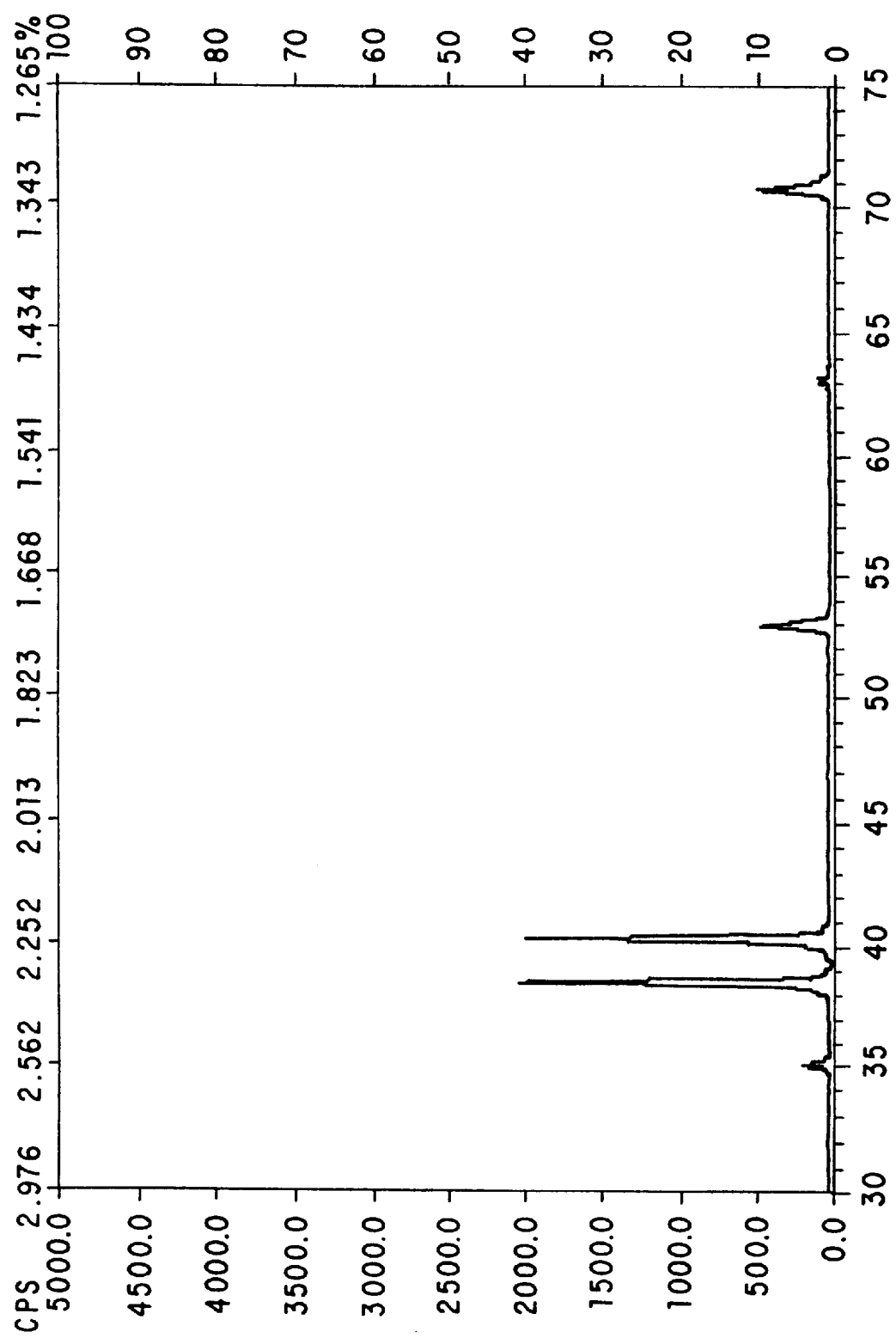
Figure 8D:
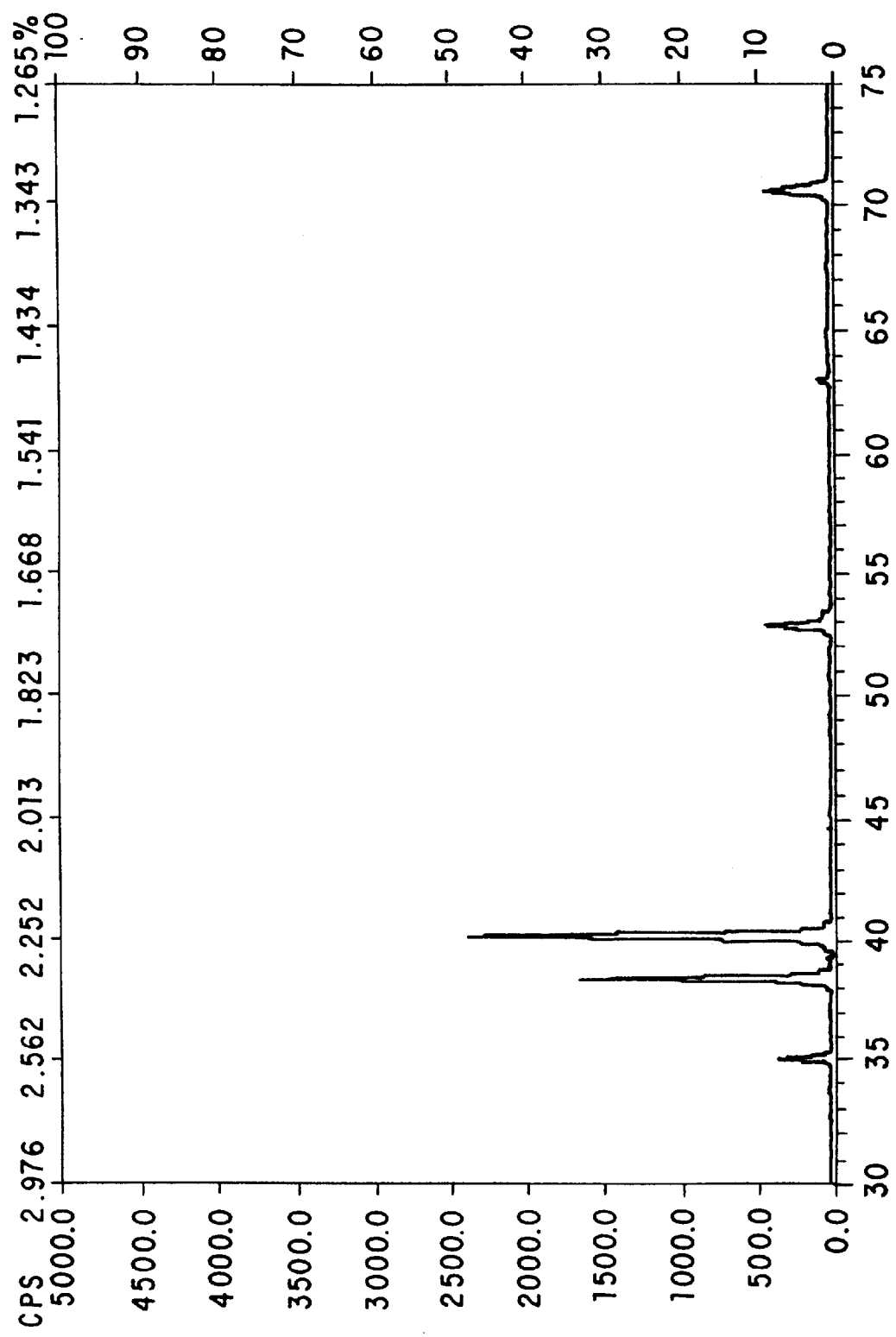

FIG. 8A is the X-ray diffraction pattern of a target surface after machining. FIG. 8B is the X-ray diffraction pattern of a target surface after a chemical etching treatment for one minute. FIG. 8C is the X-ray diffraction pattern of a target surface after a chemical etching treatment for five minutes. FIG. 8D is the X-ray diffraction pattern of a target surface after a chemical etching treatment for ten minutes.

Any type of target can be produced with the invention, including any materials and single piece targets as well as bonded assemblies. The targets can be used in any sputtering systems, the invention is not sputtering system dependent. Preferably, the targets are used in planar magnetron sputtering systems.

The portion of the target to be treated can also vary depending on the sputtering process. Generally, one side of the target is used for sputtering and this side is subjected to the surface treatment. However, depending on the target configuration and use, other portions of the target can be subjected to the surface treatment step.

The surface treatment step does not impact any of the other critical parameters of the target such as grain size, crystallographic orientation, bulk impurity and gas content and the like.

Once the target is surface treated, at least the surface treated portion is protected with a metallic enclosure. The metallic enclosure separates and isolates the surface treated portion from subsequent exposure and/or contact with possible contaminating material, e.g., plastic packing bags used for storage and shipment, airborne contaminants such as dust or the like, moisture, or any other materials which, when put in contact with the surface treated portion of the target, could adversely affect the sputtering operation.

Referring to FIG. 1, an exemplary target assembly is generally designated by the reference numeral 10 and includes the target 1 with the surface treated portion 3 thereon and a metallic enclosure 5 in the shape of a cover or cap. The cover 5 has a peripheral lip 7 which, with the cover body 9, encloses the surface treated portion 3 of the target 1.

Figure 9:
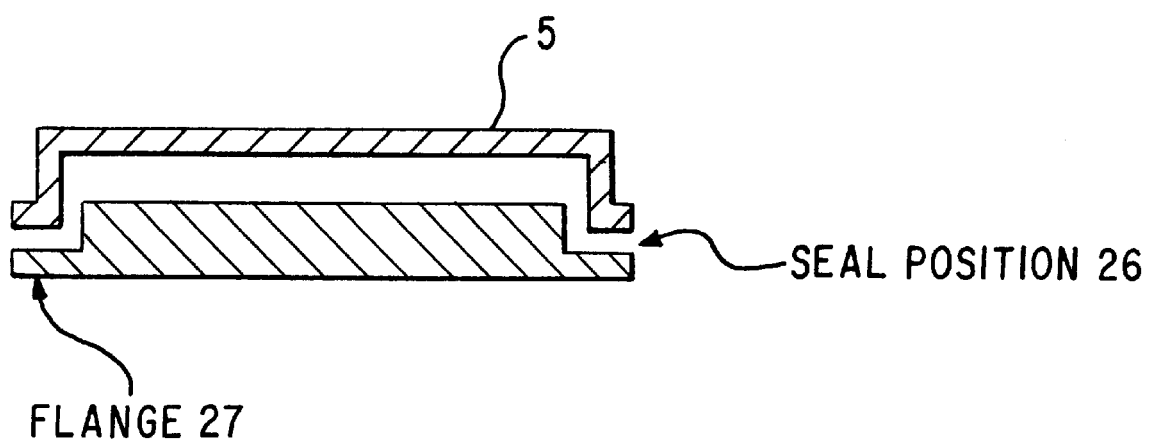
FIG. 9 is an exploded view which shows detail of the relation between the target and cover and the seal therebetween.

A more detailed depiction of a target and a cover is shown in FIG. 9. A seal or a spacer 26 can be placed between the target flange 27 and the cover 5 to protect the target from being scratched and further protect the target surface. The seal is sized so that the seal surface engages the flange of the target. This engagement may be used as a seal to further isolate and separate the surface treated portion from potential contamination.

Referring back to FIG. 1, the cover is sized so that an inner wall 11 of the lip 7 encloses the sidewall 13 of the target 1. This engagement or seal further isolates and separates the surface treated portion 3 from potential contaminants. Of course, other types of seals rather than a friction or pressure fit can be used, for example, gaskets, O-rings, removable adhesives, tape or the like.

The fit between the lip 7 and the target 1 should leave a sufficient gap between the underside 15 of the cap body 9 and the surface treated portion 3 to prevent contact therebetween when the cover is installed and/or removed. The fit between the lip 7 and the sidewall 13 must also be designed to prevent scratching of the sidewall 13.

Other configurations of the cover 5 can be used, particularly depending on the target configuration. For example, a metallic enclosure comprising two halves which can be attached together could be employed to enclose the entire target. Alternatively, the metallic enclosure could be in the shape of a container with a door to access the container inside for target insertion and removal.

It should also be understood that the target configuration can be any type known in the art, for example, circular, oval, rectangular, square or any other shape.

Figure 2:
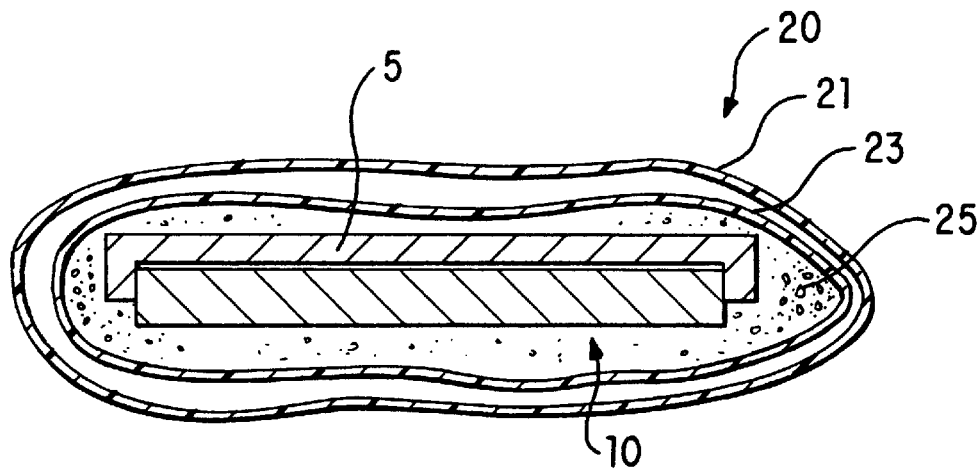
FIG. 2 is a cross-sectional view of another embodiment of the target assembly of the invention.

Once the cover 5 is in place, the target assembly 10 can be further packaged. FIG. 2 shows an exemplary cross-section of a further packaging, i.e., a double plastic bag assembly 20 comprising a pair of plastic bags 21 and 23. Although not shown, the plastic bags 21 and 23 can have closures to permit insertion of the target assembly 10 into the bag 23 followed by insertion of the target assembly-containing bag 23 into the bag 21.

As stated above, the cover 5 is preferably metallic. The metallic cover prevents contact or exposure between the plastic bag 23 and the surface of the target. Plastic or polymeric materials tend to contaminate the target surface by providing a source of organic material which would be detrimental if present in the sputtering or burn-in process. The metallic cover eliminates contact between the target and any plastic and any source of organic radicals and carbon generated during sputtering and/or burn-in. It should be understood that any metal having sufficient strength can be used as the metal for the cover or enclosure, e.g., ferrous or non-ferrous metals, either in laminate, coated, composite or other known forms. The cover can comprise a non-metallic core, e.g. plastic, a composite or the like, and a metal coating thereon. The metal coating can cover the entire non-metallic core or just the portion adjacent the surface treated target portion. For purposes of this invention, a metallic enclosure is deemed to encompass any enclosures having at least a metal portion protecting and/or isolating the surface treated target portion.

The assembly 20 can also include a desiccant 25. The purpose of the desiccant is to reduce water vapor that can be adsorbed by the target. Since these desiccants are well known in the art, a further description is not deemed necessary for understanding of the invention.

Figure 3:
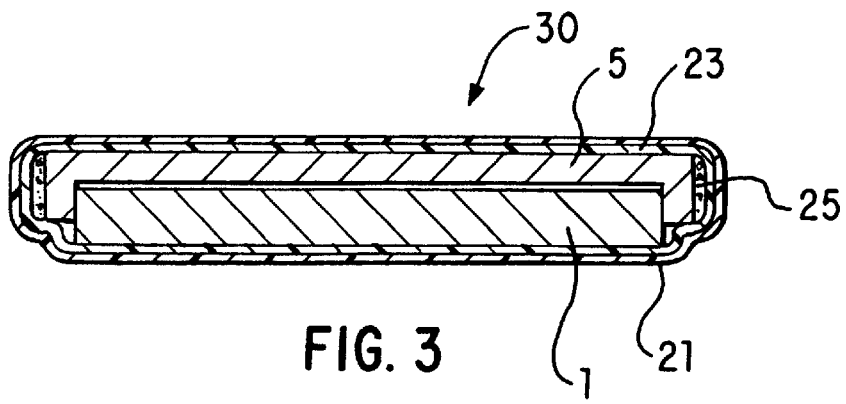
FIG. 3 is a cross-sectional view of the target assembly of FIG. 2 subjected to evacuation.

Once the target assembly 10 is enclosed by the double-bag assembly 20, the assembly 20 can be evacuated to form the package 30 as shown in FIG. 3. The package 30 is then ready for transport or storage prior to use of the target for reduced, final burn-in and subsequent sputtering.

The plastic enclosures and desiccant depicted in FIGS. 2 and 3 are preferred embodiments of the present invention. However, other types of enclosures and/or desiccants can be used to enclose the target assembly 10. For example, a single plastic bag or a shrink-wrap plastic film could be utilized. The plastic for use in the bag or film can be a moisture and/or gas resistant type such as polyethylene to provide an additional mode of protection for the target.

Figure 4A:
FIGS. 4A and 4B are graphics to illustrate the surface defects of a target with a machined target surface obtained by conventional methods.
Figure 4B:
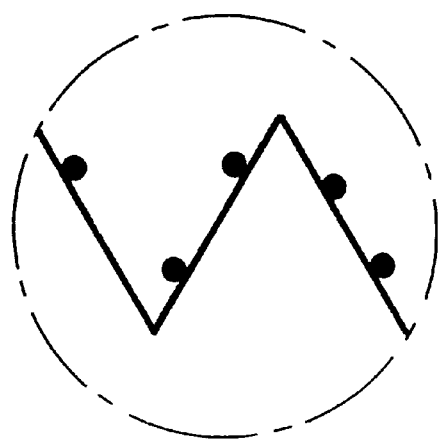

A depiction of a typical and conventionally produced target surface profile of a machined target is shown in FIG. 4A. An enlarged portion of the machine target surface is depicted in 4B. Conventional machining can result in one or more defects such as deformed material, smearing, twins, and/or burns on the machined target surface. FIGS. 4A and 4B also show the presence of contaminants on the machine target surface. The surface treatment step of the invention removes the defects mentioned above and can also reduce the microscopic surface area of the machined target surface. In other words, the conventionally machined target surface is made flatter, i.e., the peaks are reduced in size, so that the overall surface area is lessened. The surface treatment results in a significant decrease in the generation of particles added during the sputtering process.

Figure 5:
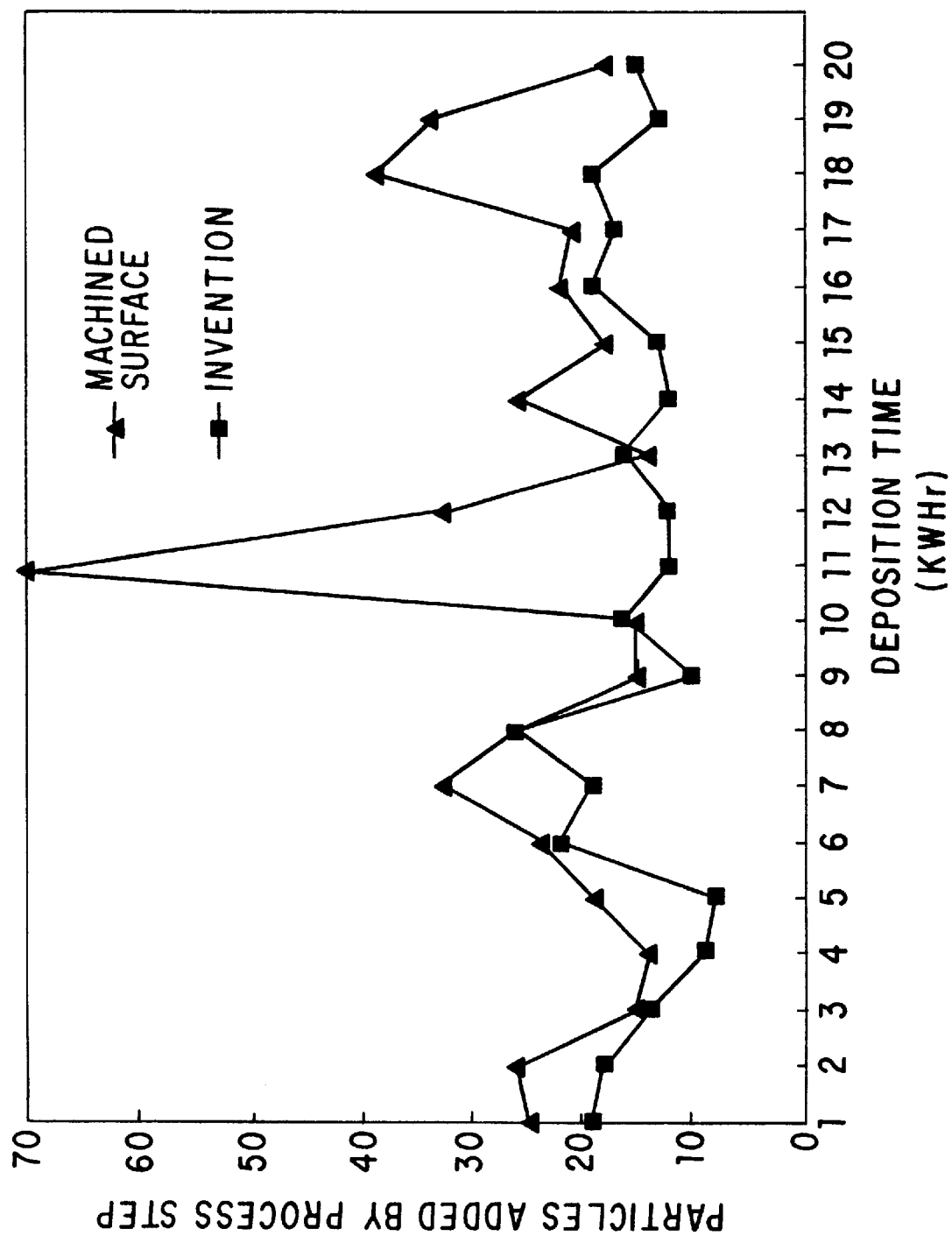
FIG. 5 is a graph relating particles added during sputtering and deposition time for a conventional machined surface and the invention.
Figure 7A:
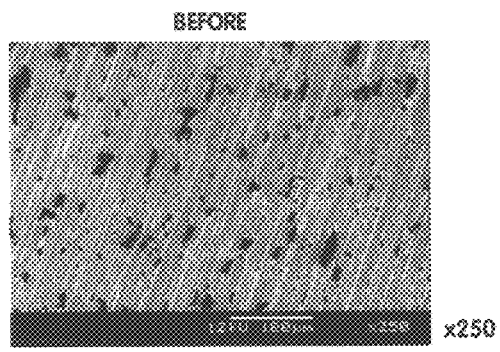
FIG. 7A, 7B, 7C and 7D are scanning electron microscope (SEM) micrographs showing the effect of ion etching on the surface of titanium targets at X250 and X1000, respectively.
Figure 7B:
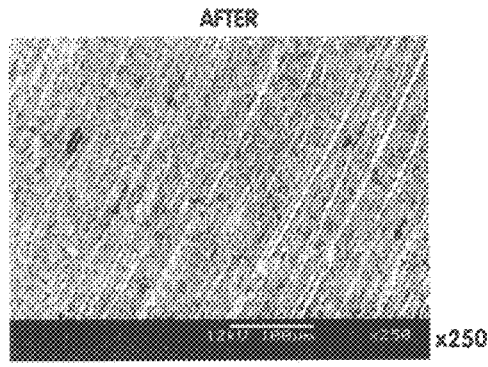
Figure 7C:
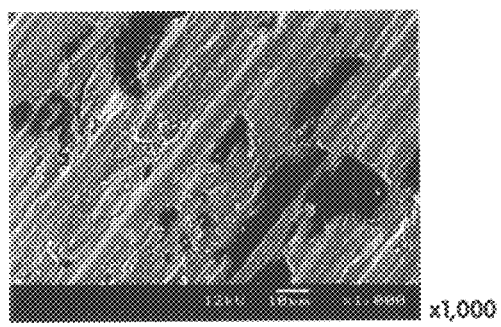
Figure 7D:
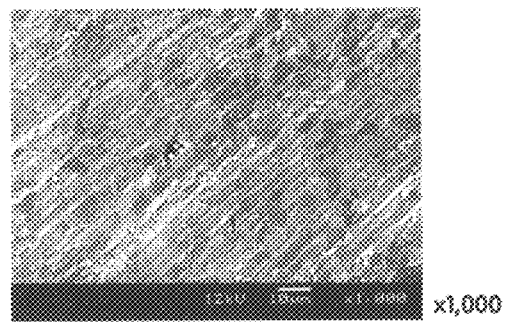

In order to demonstrate the improvements associated with the inventive target, method and apparatus, comparative test work was performed. FIG. 5 shows the number of particles greater than 0.19 microns in size added per wafer during sputtering operation for 200 mm wafers as measured by a Tencor 6200 tools with a 3 mm edge exclusion. In this graph, the performance of the inventive target is compared to that of a prior art target made from the same material with identical metallurgical properties. The same apparatus (an Applied Materials Endura 5500 sputtering system), burn-in procedure (~10 microns deposited film), and operating conditions were used in testing each type of target. The graph depicts the performance of the targets during the first 20 kwh (kilo watt hour) of life after the burn-in. It is clearly evident from FIG. 5 that the conventionally machined surface produces a significantly increased number of particles added per wafer, with a large wafer to wafer variation as compared to a target surface treated and packaged according to the invention. The inventive target was processed by ion etching the sputtering surface of the target. Looking at the surface appearance of the machined and ion etched targets in FIGS. 7A–7D, it is clearly evident that the inventive target surface treatment removed the contaminants and machined defects dramatically reducing particle generation at beginning of life. Another inventive target was processed by chemical etching. Looking at the surface appearance of the machined and chemically etched targets in FIGS. 8A–8D, it is clearly evident that the inventive target surface that all machining grooves and deformed material have been removed to reveal the underlying grain structure. This allowed a reduction of burn-in time from 5–6 hours to less than one hour to achieve a low particulate stable process.

As stated above, a thin barrier film can be applied to the surface treated portion of the target for passivation purposes. The thin metal film can be any type which will passivate the target surface but can still be removed during the burn-in and/or sputtering and could promote adhesion to "back sputtered" fixtures such as shielding operations. Generally, a native oxide film will form once a target is manufactured, e.g., $TiO_2$ on titanium or $Al_2O_3$ on aluminum. These oxides should be removed during burn-in but are difficult to sputter and may be present at slower eroding regions of the target for a significant period of the target life. By application of the passivating layer to the surface treated portion of the target, the natural oxide film cannot form. Thus, additional burn-in time is not required for its removal. The thin metal film can be a precious metal-containing film such as one selected from the platinum group or the gold group. However, any material which will prevent contamination or oxidation of the surface treated target portion can be utilized.

The manner of applying the passivating barrier film can be any known metallic coating process. Examples of such processes include flame spraying, arc spraying, plasma spraying, laser coating, electrostatic powder coating, slurry coatings, roll bonding, powder rolling, mechanical impingement, explosive bonding, plasma-transferred arc cladding, chemical vapor deposition, thermal decomposition, physical vapor deposition techniques such as evaporation or reactive evaporation, ion plating, sputtering and ion implantation or other similar type processes. These processes must be performed in-situ with the cleaning process to prevent the formation of oxides. Since these processes are well known in the art, a further description thereof is not deemed necessary for understanding of the invention.

Figure 6:
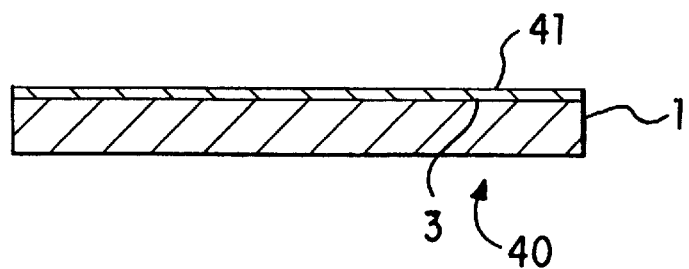
FIG. 6 shows a surface treated target for the invention with a barrier coating thereon.

FIG. 6 shows an exemplary passivated and surface treated target designated by the reference numeral 40. The passivation layer 41 is coated on the surface treated portion of the target. The target with the passivation layer 41 can then be packaged, stored and shipped as described above.

With the inventive method and target assembly, significant benefits are realized in a reduction of particle level and foreign elements in the sputter chamber and the required burn-in time. As a result, the lifetime of the target and the device yield are increased, thereby reducing the system cost of ownership.

The reduction of particles and impurities generated during the burn-in stage may also prolong tool uptime before preventive maintenance/shield kit changes have to be performed. In addition, the surface treatment method and target assembly is not system dependent. It can be used in any sputtering system, particularly, planar magnetron sputtering systems. The inventive method is good for any target materials including aluminum, titanium, transition metals, refractory metals, silicides, indium tin oxide, composites, bonded assemblies or combinations thereof. The improvements described above are achieved without any compromise in the end user's process, product specification such as uniformity, deposition rate, particles, etc.

As such, an invention has been disclosed in terms of preferred embodiments thereof which fulfill each and every one of the objects of the present invention as set forth above and provides a new and improved method for reducing the burn-in time for sputtering targets and an improved target assembly.

Of course, various changes, modifications and alterations from the teachings of the present invention may be contemplated by those skilled in the art without departing from the intended spirit and scope thereof. Accordingly, it is intended that the present invention only be limited by the terms of the appended claims.

What is claimed is:

1. In a method of preparing a target surface prior to using the target for sputtering, the improvement comprising, prior to burn-in:
   a) subjecting at least a portion of the target to a non-mechanical surface treatment step to produce a target surface treated portion whereby at least one of impurities present on the target surface treated portion is removed and a surface area of the target surface treated portion is reduced; and
   b) placing at least the target surface treated portion of the target in a metallic enclosure sized to enclose at least the target surface treated portion, the metallic enclosure preventing contact between the target surface treated portion of the target and a subsequently used plastic enclosure encompassing the metallic enclosure;
   c) wherein the non-mechanical surface treatment step and the metallic enclosure reduce burn-in.

2. The method of claim 1, comprising the step of enclosing the metallic enclosure and target in a plastic enclosure.

3. The method of claim 2, comprising the step of evacuating the plastic enclosure.

4. The method of claim 2, comprising the step of placing a desiccant into the plastic enclosure.

5. The method of claim 4, comprising the step of evacuating the plastic enclosure.

6. The method of claim 5, wherein the non-mechanical surface treatment step comprises surface treating the portion of the target by one of ionic cleaning, ionic milling, sputtering, chemical etching, chemical polishing, electrolytic polishing, electrolytic etching, laser ablation, electron beam ablation, or combinations thereof.

7. The method of claim 6, wherein the non-mechanical surface treatment step comprises ionic cleaning.

8. The method of claim 1, wherein the non-mechanical surface treatment step comprises surface treating the portion of the target by one of ionic cleaning, ionic milling, chemical etching, sputtering, chemical polishing, electrolytic polishing, electrolytic etching, laser ablation, electron beam ablation, or combinations thereof.

9. The method of claim 8, wherein the non-mechanical surface treatment step comprises ionic cleaning.

10. The method of claim 1, wherein the metallic enclosure is made of a non-metallic core with a metal coating.

11. The method of claim 1, wherein the metallic enclosure is a cover with at least a metallic portion sized to attach to the target so that at least the metallic portion of the cover encloses at least the surface treated portion of the target.

12. The method of claim 11, wherein the cover has a lip engaging a peripheral edge of the target.

13. The method of claim 12 wherein the cover comprises a metal cap.

14. The method of claim 1 comprising applying a passivating coating on at least the target surface treated portion of the target.

15. The method of claim 14 wherein the passivating coating is an applied layer of a precious metal or other non-oxidizing material.

16. The method of claim 1, wherein said non-mechanical surface treatment step is effective to remove deformed material, smearing, twins or burrs present on said surface.

17. A target assembly for reducing burn-in time of a target prior to target sputtering comprising:
   a) a sputtering target having at least a treated surface portion non-mechanically surface treated so that at least one of impurities on the surface treated portion is removed and a surface area of the surface treated portion is reduced; and
   b) a metallic enclosure sized to enclose at least the surface treated portion of said sputtering target so that at least the surface treated portion of the sputtering target is separated from a packaging enclosure subsequently used to surround the metallic enclosure and sputtering target, reducing said burn-in time.

18. The target assembly of claim 17, the packaging enclosure comprising a plastic enclosure surrounding the metallic enclosure and the target.

19. The target assembly of claim 18, comprising a desiccant inside the plastic enclosure.

20. The target assembly of claim 17, the packaging enclosure comprising a vacuum plastic enclosure surrounding the metallic enclosure and the target.

21. The target assembly of claim 20, wherein the vacuum plastic enclosure is a double bag.

22. The target assembly of claim 17, wherein the metallic enclosure is a cover with at least a metallic portion sized to attach to the target so that at least the metallic portion of the cover encloses at least the surface treated portion.

23. The target assembly of claim 22, the packaging enclosure comprising a plastic enclosure surrounding the cover and the target.

24. The target assembly of claim 23, wherein the plastic enclosure is a vacuum double bag with a desiccant therein.

25. The target assembly of claim 17, wherein the metallic enclosure is a cover with at least a metallic portion and a peripheral lip, the cover being sized so that the peripheral lip engages a peripheral edge of the target so that at least the metallic portion of the cover encloses at least said surface treated portion.

26. The target assembly of claim 25, wherein the cover is a metal cap.

27. The target assembly of claim 17, wherein the surface treated portion has a barrier layer thereon.

28. The target assembly of claim 27, wherein the barrier layer comprises a precious metal or other non-oxidizing material.

29. The target assembly of claim 17, wherein said surface treated portion is substantially devoid of deformed material, smearing, twins or burrs.

* * * * *